United States Patent
Akagawa et al.

(10) Patent No.: US 7,445,965 B2
(45) Date of Patent: Nov. 4, 2008

(54) METHOD OF MANUFACTURING RADIATING PLATE AND SEMICONDUCTOR APPARATUS USING THE SAME

(75) Inventors: Masatoshi Akagawa, Nagano (JP); Masao Nakazawa, Nagano (JP); Hideto Nakazawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 386 days.

(21) Appl. No.: 11/096,058

(22) Filed: Mar. 31, 2005

(65) Prior Publication Data

US 2005/0221536 A1  Oct. 6, 2005

(30) Foreign Application Priority Data

Mar. 31, 2004  (JP) .............................. 2004-104165

(51) Int. Cl.
*H01L 21/00* (2006.01)
(52) U.S. Cl. ................ 438/122; 438/118; 257/E21.519
(58) Field of Classification Search .................. 438/122
See application file for complete search history.

(56) References Cited

U.S. PATENT DOCUMENTS

| | | | | |
|---|---|---|---|---|
| 4,620,215 A | * | 10/1986 | Lee | 257/713 |
| 5,503,704 A | * | 4/1996 | Bower et al. | 156/281 |
| 6,504,242 B1 | * | 1/2003 | Deppisch et al. | 257/707 |
| 6,773,963 B2 | * | 8/2004 | Houle | 438/122 |
| 6,882,043 B2 | * | 4/2005 | Dishongh et al. | 257/713 |
| 6,902,987 B1 | * | 6/2005 | Tong et al. | 438/455 |
| 6,916,688 B1 | * | 7/2005 | Kelkar et al. | 438/122 |
| 6,952,050 B2 | * | 10/2005 | Kwon et al. | 257/707 |
| 6,979,899 B2 | * | 12/2005 | Edwards | 257/704 |
| 7,034,469 B2 | * | 4/2006 | Ballenger et al. | 315/209 SC |
| 7,319,048 B2 | * | 1/2008 | Lu et al. | 438/106 |
| 7,362,580 B2 | * | 4/2008 | Hua et al. | 361/709 |
| 7,387,944 B2 | * | 6/2008 | Tong et al. | 438/455 |
| 2004/0188814 A1 | | 9/2004 | Houle et al. | |

FOREIGN PATENT DOCUMENTS

| | | |
|---|---|---|
| JP | 7-106477 | 4/1995 |
| JP | 2003-101243 | 4/2003 |
| JP | 2004-327718 | 11/2004 |

* cited by examiner

*Primary Examiner*—David A Zarneke
(74) *Attorney, Agent, or Firm*—Rankin, Hill & Clark LLP

(57) ABSTRACT

A method of manufacturing a radiating plate using In as a thermal conducting bonding material 20 provided between a semiconductor device and a radiating plate 14 and serving to bond a back surface of the semiconductor device to the radiating plate, includes the steps of carrying out a cleaning treatment for cleaning a surface of the radiating plate 14, supplying the In to the radiating plate 14, heating and melting the In and hermetically adhering the In 18 to the radiating plate, thereby obtaining an In integral type radiating plate.

2 Claims, 4 Drawing Sheets

FIG. 2
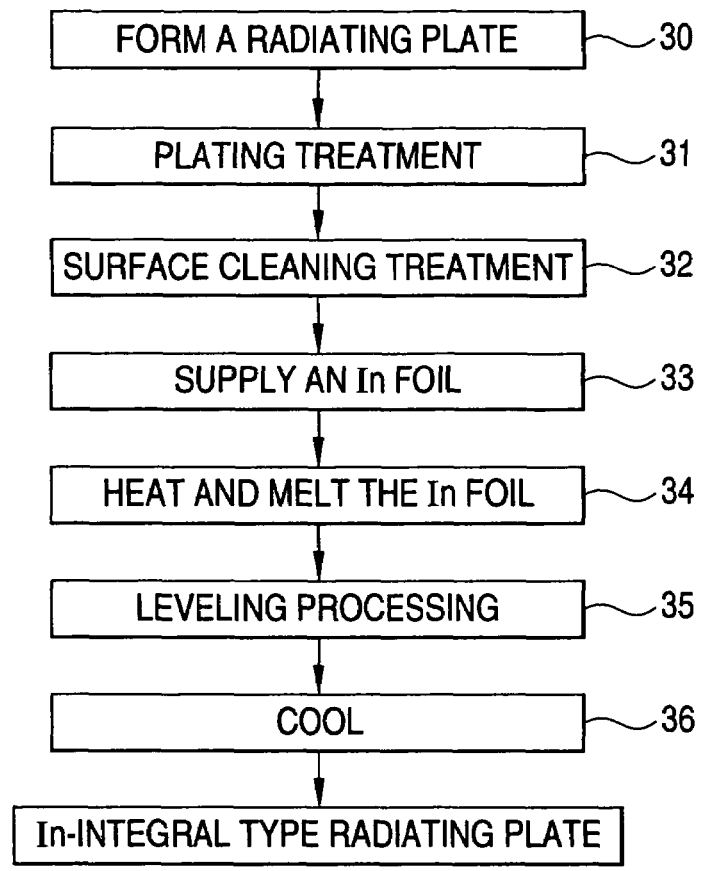
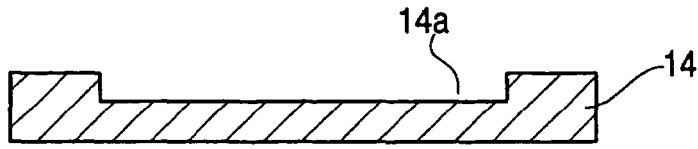
FIG. 3 (a)
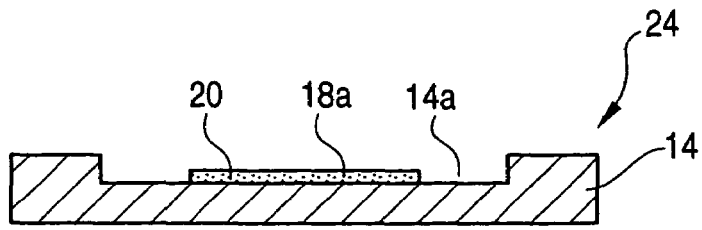
FIG. 3 (b)

FIG. 4
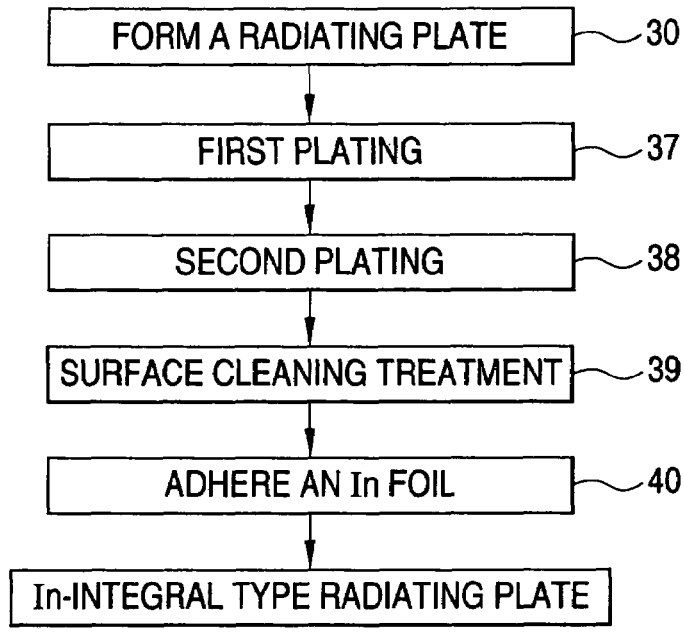
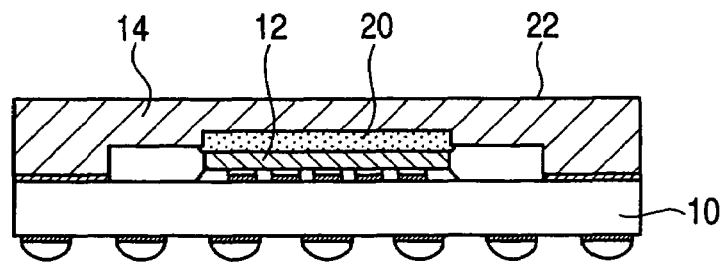
FIG. 5 (a)
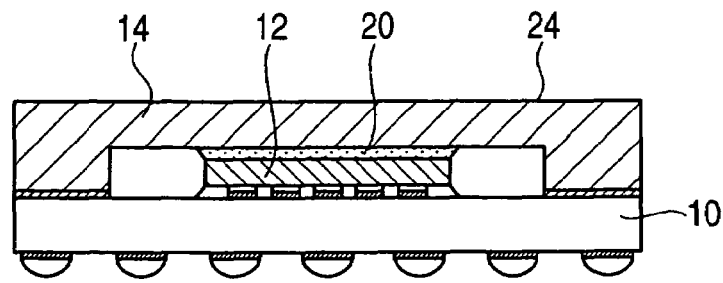
FIG. 5 (b)

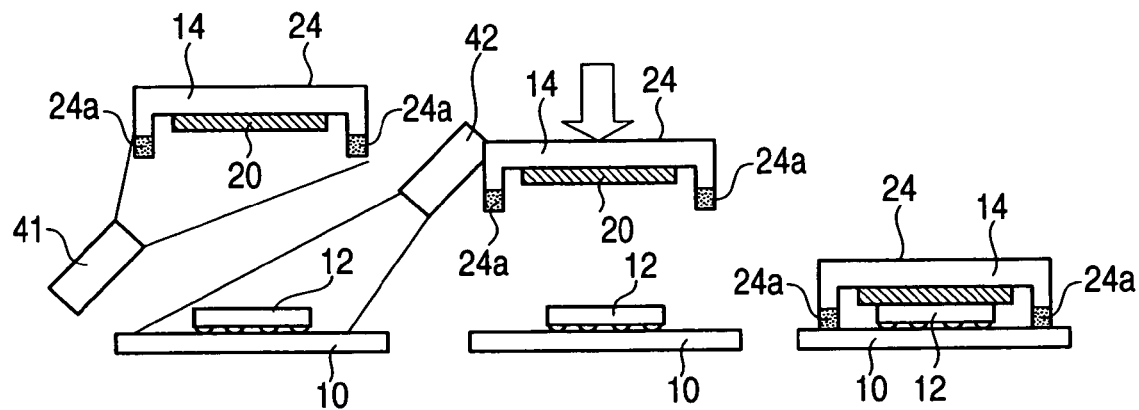
FIG. 6 (a)   FIG. 6 (b)   FIG. 6 (c)
FIG. 7
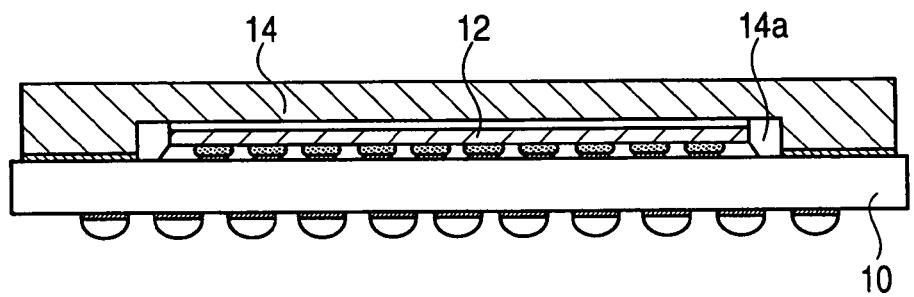

METHOD OF MANUFACTURING RADIATING PLATE AND SEMICONDUCTOR APPARATUS USING THE SAME

BACKGROUND OF THE INVENTION

1. Field of the Invention

The present invention relates to a method of manufacturing a radiating plate and a semiconductor apparatus using the radiating plate.

2. Description of the Related Art

In a semiconductor apparatus mounting a semiconductor device by a flip chip connection, a radiating plate is attached to the back surface of the semiconductor device (a surface on an opposite side to the flip chip connecting surface of the semiconductor device) to enhance the thermal radiating property thereof. FIG. 7 shows an example of a semiconductor apparatus formed by flip chip connecting a semiconductor device 12 to a substrate 10 with bonding a radiating plate 14 to the back surface of the semiconductor device 12. In this example, the radiating plate 14 is provided with a housing concave portion 14a for accommodating the semiconductor device 12 and the semiconductor device 12 is bonded to the inner bottom surface (or ceiling surface) of the housing concave portion 14a, and furthermore, the radiating plate 14 is bonded to the substrate 10 to surround a region on which the semiconductor device 12 is mounted.

In FIG. 7, the radiating plate 14 is formed in a cap-shape to protect the semiconductor device 12 and to enhance the thermal radiating function of the semiconductor device 12. Various configurations might be used for the radiating plate 14, for example, a radiating plate with radiating fin being provided.

The radiating plate which might be employed in this invention includes so called heat-sink, heat-slug, heat-spreader and so on.

In the case in which the radiating plate 14 is attached to the semiconductor device 12, a thermal conductor such as a solder or a high-temperature conducting resin, such as epoxy resin, is interposed between the semiconductor device 12 and the radiating plate 14 for their assembling in order to enhance a thermal conductivity between the semiconductor device 12 and the radiating plate 14. In some cases such that the thermal conductor is provided between the semiconductor device 12 and the radiating plate 14, the thermal conductor is interposed between the semiconductor device 12 and the radiating plate 14 where pressure contact is performed to assemble them. In general, however, heat treatment might be performed to the solder or the high-temperature conducting resin rather than pressure contact so that the thermal conductor fills clearance between the back surface of the semiconductor device 12 and the radiating plate 14, which ends up being bonded integrally with each other.

If the thermal conductor is heated and molten to bond the semiconductor device 12 to the radiating plate 14 with high temperature, however, there is a possibility of causing a great thermal stress between the substrate 10 and the semiconductor device 12, as well as between the radiating plate 14 and the semiconductor device 12, resulting in the damage of the semiconductor device 12. As in the case in which the solder is used as the thermal conductor, moreover, if the thermal conductor is molten to bond the semiconductor device 12 to the radiating plate 14, there is a problem of the generated voids remaining between the back surface of the semiconductor device 12 and the radiating plate 14, which does not fill up the clearance portion completely, resulting in tampering a thermal conductivity in some cases. On the other hand, in the case in which the high-temperature conducting resin is used as the thermal conductor, giving the priority to good filling condition of the thermal conductor, there is a problem of the thermal conductivity turning to be lower in comparison of a metal material such as the solder.

SUMMARY OF THE INVENTION

Therefore, the invention has been made in order to solve these problems, and it is one of objects in this invention to provide a radiating plate in used of a semiconductor device and its manufacturing methods, which can enhance a thermal conductivity between a semiconductor device and a radiating plate that is bonded to the back surface of the semiconductor device. This is resulting in improvement of the heat radiating characteristics of the radiating plate.

Further, it is another object of this invention to provide a radiating plate in used of a semiconductor device and its manufacturing method, which enables the radiating plate to keep its thermal conductivity high between the semiconductor device and the radiating plate bonded to the back surface thereof. This is not only improving the heat radiating characteristics of the radiating plate, but also manufacturing the radiating plate more readily, which makes it possible to assemble the semiconductor apparatus more readily.

Moreover, it is another object of this invention to provide a semiconductor manufacturing methods by using a radiating plate which can alleviate the thermal stress being imposed on the semiconductor device and the radiating plate in case of the both being bonded together. This method is resulting in significant reduce of the damage given to the semiconductor device.

In order to attain the object, the invention has the following structure.

More specifically, a method of manufacturing a radiating plate using In as a thermal conducting bonding material interposing between a semiconductor device and a radiating plate, serving to bond a back surface of the semiconductor device to the radiating plate, comprises the steps of forming the radiating plate to have a predetermined shape, carrying out a cleaning treatment for cleaning a surface of the radiating plate, supplying the In onto the radiating plate, heating and melting the In and hermetically adhering the In to the radiating plate, and carrying out a leveling processing for flattening a surface of the thermal conducting bonding material being formed of said In, thereby obtaining an In integral type radiating plate. As for the In being supplied onto the radiating plate, it is possible to use a In-made foil. For the leveling processing, moreover, a mechanical processing using a punch might be utilized.

The radiating plate according to the invention can be utilized in a semiconductor apparatus in which a semiconductor device is flip chip connected to a substrate and the radiating plate is attached to the back surface of the semiconductor device. The structure of the semiconductor apparatus attaching the radiating plate and the shape of the radiating plate are not particularly restricted.

For the pretreatment of the cleaning step, moreover, plating treatment is carried out to the surface of the radiating plate before a cleaning treatment is carried out. For the plating treatment of the radiating plate, nickel plating and gold plating might be utilized.

Furthermore, a method of manufacturing a radiating plate using In as a thermal conducting bonding material interposed between a semiconductor device and a radiating plate, serving to bond a back surface of the semiconductor device to the radiating plate, comprises the steps of forming the radiating plate to have a predetermined shape, carrying out plating over a surface of the radiating plate, performing a cleaning treatment for cleaning the surface of the radiating plate, and pressing an In-made foil onto a predetermined position of the radiating plate, thereby obtaining an In integral type radiating plate.

In addition, it is effective that an electrolytic treatment, in which the radiating plate is set to be a cathode in an electrolyte, is carried out as the cleaning treatment. Otherwise, it is also effective that the radiating plate and the In-made foil are immersed in a sulfuric acid solution respectively for the cleaning treatment.

In a semiconductor apparatus assembled by using a radiating plate manufactured by the method of manufacturing a radiating plate, furthermore, In-containing thermal conducting bonding material that is provided on the radiating plate, which is molten for assembling the semiconductor apparatus, filling the clearance between a back surface of a semiconductor device and the radiating plate so that the semiconductor device and the radiating plate are bonded to each other.

The semiconductor apparatus according to the invention employs In or In-alloy as the thermal conducting bonding material. Consequently, it is not necessary to heat the radiating plate to a high temperature in the assembly of the semiconductor apparatus. Accordingly, fitting condition at the contact surface between the semiconductor device and the radiating plate can be improved, and as the result, generation of the voids is significantly suppressed. Further, in this invention, since a surface activated bonding method or room-temperature bonding method is employed instead of high temperature heating treatment, it is possible to assemble the semiconductor apparatus without any excessive thermal stress being imposed on the semiconductor device.

Thus, it is possible to suppress the damage of the semiconductor device in the assembly. Moreover, the In-containing thermal conducting bonding material has a higher thermal conductivity as compared with a resin type material. Consequently, it is possible to provide a semiconductor apparatus with having a thermal suitable radiating property.

Moreover, thanks for the room-temperature bonding method being applied for assembling the semiconductor apparatus, it is possible to solder the peripheral edge portions of the radiating component and the substrate at the same time of bonding the In-containing thermal conductive bonding material, structuring a part of the radiating component, and the back surface of the semiconductor device, with the temperature far below from the melting temperatures those metals in use have.

Consequently, the present invention makes it possible to shorten the time for the assembly without creating any excessive thermal stress, and the damage given to the semiconductor device is significantly suppressed.

According to the method of manufacturing a radiating plate in accordance with the invention, the radiating plate comprising the In-containing thermal conducting bonding material can be manufactured readily and the thermal conducting bonding material can be reliably adhered without generating voids between the In and the radiating plate. Consequently, a radiating plate having a high thermal radiating efficiency is provided. Moreover, the radiating plate is provided in a state in which the In-containing thermal conducting bonding material is integrally attached to the radiating plate. Consequently, it is possible to easily carry out a work for assembling a semiconductor apparatus. Moreover, the semiconductor apparatus according to the invention is assembled by using the radiating plate comprising the In-containing thermal conducting bonding material. Thus, it is possible to provide a semiconductor apparatus having an excellent thermal radiating property.

BRIEF DESCRIPTION OF THE DRAWINGS

FIG. 2 is a flowchart showing a process for manufacturing a radiating plate, FIGS. 3(a) and 3(b) are the explanatory views showing another method of manufacturing a radiating plate, FIG. 4 is a flowchart showing a process for manufacturing a radiating plate, FIGS. 5(a) and 5(b) are the explanatory views showing the structure of a semiconductor apparatus according to the invention, and FIGS. 6(a) to 6(c) show the explanatory views showing the manufacturing processes of FIG. 5(b).

FIG. 7 is an explanatory view showing the structure of a semiconductor apparatus of the related art to which a radiating plate is attached.

DESCRIPTION OF THE PREFERRED EMBODIMENTS

Preferred embodiments of the invention will be described below in detail with reference to the accompanying drawings.

First Embodiment

FIGS. 1(a) to 1(f) are the explanatory views showing a process for manufacturing a radiating plate according to the invention and FIG. 2 is a flowchart showing a manufacturing process according to a first embodiment.

Figure 1:
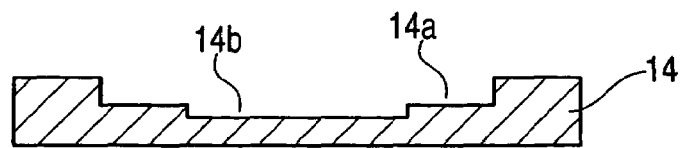
FIGS. 1(a) to 1(f) are the explanatory views showing a method of manufacturing a radiating plate according to the invention.
Figure 1:
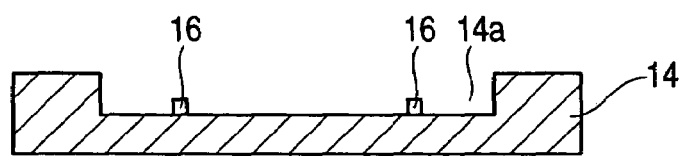
Figure 1:
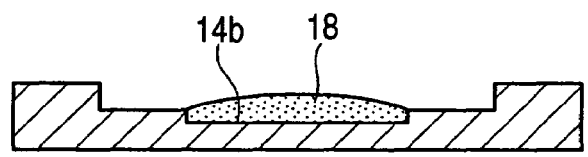
Figure 1:
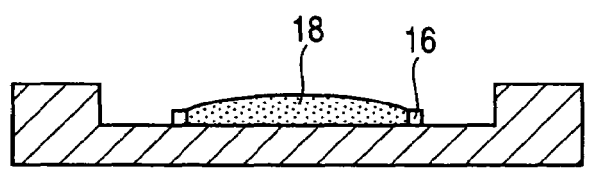
Figure 1:
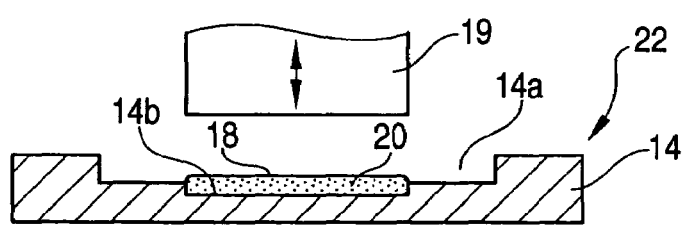
Figure 1:
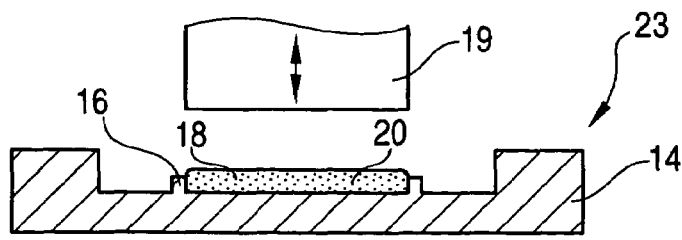

FIGS. 1(a) and 1(b) show a state in which a radiating plate 14 is formed to take a predetermined shape at a radiating plate forming step 30 using a press processing shown in FIG. 2.

FIG. 1(a) shows a state in which a housing concave portion 14a is formed on the base material of the radiating plate 14 and a concave portion 14b is formed in the central part of the housing concave portion 14a. Both the housing concave portion 14a and the concave portion 14b take a rectangular planar shape in the embodiment.

FIG. 1(b) shows another example of the structure of the radiating plate 14, in which the housing concave portion 14a is formed on a base material by a press processing and a resin material such as an epoxy resin is then applied like a frame onto the bottom surface of the housing concave portion 14a, thereby forming a barrier 16.

A region surrounded by the concave portion 14b and the barrier 16 corresponds to a region on which a semiconductor device is mounted when a semiconductor apparatus is assembled.

Although a proper material can be used as the substance of the base material of the radiating plate 14, it is preferable to use copper or aluminum metal for this use. More specifically, a copper plate having a thickness of 0.8 mm is used in the embodiment. The radiating plate 14 is formed to have a rectangular planar shape, and the radiating plate 14 according to the embodiment is formed to have a size of 25 mm square.

Moreover, the concave portion 14b is formed to have a side of 10 mm square and the barrier 16 is formed like a frame of 10 mm square. The concave portion 14b has a depth of 0.2 mm and the height of the barrier 16 from the bottom surface of the housing concave portion 14a is 0.2 mm.

After the radiating plate 14 is thus formed, plating is carried out over the radiating plate 14 (a plating step 31 in FIG. 2). The plating treatment is carried out to hermetically adhere a thermal conducting bonding material formed of an In metal to the surface of the radiating plate 14 reliably. Thus, the plating for enhancing a wettability with the In is carried out.

For the plating treatment, nickel plating or gold plating is carried out over the surface of the radiating plate 14 in the embodiment. According to circumstances, the nickel plating and the gold plating may be performed in this order. While a plating method is not particularly restricted, a sulfamic acid nickel plating solution is used to give a mean plating thickness of approximately 5 μm for the nickel plating, for example. For the gold plating, for example, a cyan gold bath put on the market is used (for example, TEMPERESIST EX manufactured by JPC Co., Ltd.) and a mean plating thickness of 0.5 μm or more is given, for example.

Next, a treatment for cleaning the surface of the radiating plate 14 (a surface cleaning step 32 in FIG. 2) is carried out. The surface cleaning treatment also serves to hermetically adhere the In-containing thermal conducting bonding material metal onto the surface of the radiating plate 14 reliably in the same manner as in the plating treatment. For the surface cleaning treatment, it is possible to utilize a dry treatment such as plasma etching or ultraviolet irradiation and a wet treatment based on chemical etching.

After the surface cleaning step 32, an In metal foil is supplied onto the radiating plate 14 (an In foil supplying step 33 in FIG. 2) and the In foil is heated and molten (an In foil heating and melting step 34 in FIG. 2).

The In foil is supplied into the concave portion 14b in case of the radiating plate 14 shown in FIG. 1(a), while In foil is supplied to an inside surrounded by the barrier 16 in case of the radiating plate 14 shown in FIG. 1(b). In both the embodiments, an In foil having a size of 12 mm square and a thickness of 200 μm is used.

FIGS. 1(c) and 1(d) respectively show a state in which the In foil supplied onto the radiating plate 14 is heated and molten. 18 denotes an In metal obtained after the melting. The molten In metal stays in the concave portion 14b and on the inside of the barrier 16 by the respective dam effect of the concave portion 14b and the barrier 16 in the corresponding radiating plate 14.

The melting temperature of In is 156.4° C. and the In can be molten by heating at 160 to 170° C. for approximately 5 minutes in a nitrogen gas.

It is noted that melting In metal foil on the surface of the radiating plate is performed prior to bonding said radiating plate and the backside of the semiconductor device for the reason such that the significant effect can be expected in adhesiveness as well as radiating property after bonding due to its own low hardness in comparison of hardness of other metal.

Next, a leveling processing is carried out over the In metal 18 obtained after the melting (a leveling step 35 in FIG. 2), and the surface of the In metal 18 obtained after the melting is flattened. FIGS. 1(e) and 1(f) respectively show a state in which the surface of the In metal 18 is subjected to the leveling by using a punch 19. After the leveling processing, a workpiece is cooled, and turns to be a radiating component (a cooling step 36).

Thus, there are obtained radiating components (In integral type radiating plates) 22 and 23 in which the radiating plate 14 and a In-containing thermal conducting bonding material 20 metal 18 are provided integrally. The radiating component 22 is obtained by adhering the thermal conducting bonding material 20 to the concave portion 14b provided in the radiating plate 14, while the radiating component 23 is obtained by adhering the thermal conducting bonding material 20 to the inside of the barrier 16 in the radiating plate 14.

The radiating components 22 and 23 are set in such a manner that the In-containing thermal conducting bonding material 20 is abutted on the back surface of the semiconductor device and heated and molten so that the semiconductor device and the radiating plate 14 are bonded to each other through the thermal conductive bonding material 20 when the semiconductor apparatus is to be assembled.

As shown in FIGS. 1(e) and 1(f), the leveling processing is respectively carried out over the In metal 18 to flatten the surface of the thermal conducting bonding material 20. Consequently, the semiconductor device and the thermal conducting bonding material 20 can be hermetically adhered and bonded reliably.

In the embodiment, moreover, the radiating plate 14 is subjected to the plating treatment and the surface cleaning treatment. Consequently, it is possible to hermetically adhere the radiating plate 14 to the In metal 18 reliably and to adhere the thermal conducting bonding material 20 to the radiating plate 14 without generating so many small gaps such as voids on the boundary surface between the radiating plate 14 and the thermal conducting bonding material 20. By adhering the thermal conducting bonding material 20 to the radiating plate 14 without generating a void (a gap) in the thermal conducting bonding material 20 itself and the boundary surface between the thermal conducting bonding material 20 and the radiating plate 14, thus, it is possible to effectively enhance the thermal radiating property of the radiating plate 14.

Second Embodiment

In the method of manufacturing an In integral type radiating plate according to the embodiment described above, the In foil is heated and molten and the In-containing thermal conducting bonding material 20 is adhered integrally with the radiating plate 14. Second and third embodiments which will be described below are characterized in that it is possible to obtain the In integral type radiating plate, having the radiating plate 14 and the In foil integrated with each other, by only causing the In foil to come in contact with the radiating plate 14 under room temperature as it is without need of heating and melting the In foil.

FIGS. 3(a) and 3(b) show the structures of the radiating plate 14 to be used in the second embodiment. In the second embodiment, an In foil is exactly adhered to the radiating plate 14 and the In foil and the radiating plate 14 are thus integrated with each other. For this reason, it is not necessary to provide a concave portion 14b and a barrier 16 shown in FIGS. 1(a) and 1(b) on the radiating plate 14. FIGS. 3(a) and 3(b) show the states in which the radiating plate 14 is formed like a cap provided with a required housing concave portion 14a.

Description will be given with reference to a flowchart showing a manufacturing process in FIG. 4.

After the radiating plate 14 made of copper is formed by a press processing (a radiating plate forming step 30), the radiating plate 14 is subjected to first plating and second plating (a first plating step 37 and a second plating step 38).

For the first plating 37, nickel plating is carried out. For the nickel plating, a sulfamic acid nickel plating solution is used and a mean plating thickness of 5 μm is given.

For the second plating 38, gold plating, copper plating, tin plating or palladium plating is carried out.

For the gold plating, a cyan gold bath put on the market (for example, TEMPERESIST EX manufactured by JPC Co., Ltd.) is used to carry out plating with gold in a thickness of 0.5 μm or more.

For the copper plating, a copper sulfate bath put on the market (for example, CAPALAND HL manufactured by Atotech Co., Ltd.) is used to carry out plating with copper in a thickness of 0.5 μm or more.

For the tin plating, a tin plating solution put on the market (for example, RONASTAN EC-706 manufactured by MELTEX Inc.) is used to carry out plating with tin in a thickness of 1.0 μm or more.

For the palladium plating, a palladium plating solution put on the market (for example, PALLABRIGHT manufactured by JPC Co., Ltd.) is used to carry out plating with palladium in a thickness of 0.1 μm or more.

Next, a cleaning treatment is carried out over the surface of the radiating plate 14 subjected to the plating (a surface cleaning step 39). In the surface cleaning treatment, platinum is set to be an anode and the radiating plate 14 subjected to the first plating and the second plating is set to be a cathode in an electrolyte containing 50 g/l of tripotassium citrate, and an electrolytic treatment is carried out at a room temperature in a current density of 1 ASD for one minute or more. The electrolytic treatment is intended for removing an oxide film present on the surface of the radiating plate 14.

Next, an In foil formed in a predetermined size is pressed into the predetermined position of the radiating plate 14 obtained after the electrolytic treatment and is thus adhered to the radiating plate 14 (an In foil adhering step 40). For the In foil, the same In foil having a size of 12 mm square and a thickness of 200 μm as that in the first embodiment is used, for example. It is also possible to immerse the In foil previously in a dilute sulfuric acid solution to clean a surface, then press the In foil against the radiating plate 14. The surface of the radiating plate 14 is cleaned by the electrolytic treatment. Therefore, the In foil is caused to come in contact with the radiating plate 14 so that the In foil is easily stuck to and integrated with the radiating plate 14.

An operation for adhering the In foil to the radiating plate (autohesion: hermetical adhesion by only touch) can be carried out at an ordinary temperature and an operation for heating and melting the In foil is not required. Therefore, the operation can be utilized effectively for a method of manufacturing an In integral type radiating plate.

FIG. 3(b) shows a radiating component (In integral type radiating plate) 24 obtained by the method described above. An In foil 18a is adhered as the thermal conducting bonding material 20 to the inner bottom surface of the housing concave portion 14a formed on the radiating plate 14, and the radiating plate 14 and the In foil 18a are integrated with each other. When an operation for sticking the In foil 18a to the radiating plate 14 is to be carried out, it is preferable to carry out an alignment in a position in which a semiconductor device is provided in a semiconductor apparatus (a position in which the back surface of the semiconductor device is bonded), thereby sticking the In foil 18a to the radiating plate 14.

If a foil having a uniform thickness is used as the In foil 18a, it is possible to hermetically adhere the back surface of the semiconductor device to the thermal conducting bonding material 20 reliably without need of leveling process such as required in the first embodiment. In this case, bonding can be performed without generating voids or gaps between the semiconductor device and the radiating plate 14 in the assembly of the semiconductor apparatus.

Third Embodiment

While the first plating and the second plating are carried out over the radiating plate 14 and the electrolytic treatment utilizing an electrolyte is then performed as the surface cleaning treatment for the radiating plate 14 in the second embodiment, a third embodiment is characterized in that a sulfuric acid solution is used to carry out the surface cleaning treatment for the radiating plate 14.

Since the structure of the radiating plate 14 and the contents of treatments in a first plating step 37 and a second plating step 38 are completely identical to those in the second embodiment, description will be omitted.

At a surface cleaning step 39 in the embodiment, the radiating plate 14 subjected to the first plating and the second plating is immersed in 1N sulfuric acid, and subsequently, an In foil is immersed in a dilute sulfuric acid solution and is put stationarily for 30 seconds or more, and the In foil is then pressed against the radiating plate 14 so that the In foil is adhered to the radiating plate 14.

Also in the embodiment, the surface of the radiating plate 14 obtained after the plating treatment is subjected to the cleaning treatment, and furthermore, the surface of the In foil is subjected to the cleaning treatment. In entirely the same manner as in the second embodiment, the In foil is caused to simply come in contact with the radiating plate 14 so that the In foil is hermetically adhered to the radiating plate 14 naturally and an In integral type radiating plate can be thus obtained. Also in this case, it is possible to hermetically adhere the radiating plate 14 as it is at the room temperature, such as required for the room-temperature bonding method, without heating the In foil. As an operation for manufacturing a radiating plate having an In foil adhered thereto, consequently, this method is very easy to perform. As for the reason why the In foil is used even in such a case of employing the room-temperature bonding method, the same reason as already explained in the first embodiment can be applied.

Fourth Embodiment

FIGS. 5(a) and 5(b) show the examples in which a semiconductor apparatus is assembled by using the radiating components. FIG. 5(a) shows an example in which the radiating component 22 illustrated in FIG. 1(e) is used, and FIG. 5(b) shows an example in which the radiating component 24 illustrated in FIG. 3(b) is used.

In the semiconductor apparatus, a semiconductor device 12 is flip chip connected to a substrate 10 and is underfilled, and the radiating components 22 and 24 are then aligned with the substrate 10 so that the peripheral edge portions of the radiating components 22 and 24 are soldered to the substrate 10, and at the same time, a thermal In-containing conducting bonding material 20 is molten so that the back surface of the semiconductor device 12 is bonded to the internal surface of the radiating plate 14.

FIG. 6 shows one of the manufacturing methods of FIG. 5(b). For instance, the peripheral edge portions of the radiating component 24a, on which soldering flux is coated, and the In-containing thermal conductive bonding material 20 are subjected to ion irradiation by the ion irradiation apparatus 41 as shown in FIG. 6(a). In this case, Ar-ion irradiation is continued for 150 seconds under the vacuum condition of $5.0 \times 10^{-5}$ torr. In the same time, the substrate 10 and the semiconductor device 12, both being already bonded together, are also subjected to Ar-ion irradiation under the same condition by another irradiation apparatus 42. While performing said Ar-ion irradiations together, the radiation component 24 is pressed down to the substrate 10, on which the semiconductor device 12 is mounted, with the pressing condition of 5 Kg load for 15 seconds so that the semiconductor apparatus is assembled as shown in FIGS. 6(b) and 6(c).

It is noted that the bonding portions subjected to the Ar-ion irradiation might be warmed up, however, the elevation of the temperature can be limited to the extend such as required for the room-temperature bonding method, which might be ranging from 50° C. to 100° C. In other words, so far as employing such a method in such a bonding process, there is no need for heating the temperature to the level of the melting temperature of metals such as In.

The property of In, being used for the thermal conductivity material in this invention, might be characterized as the lowest hardness in solid-state metals (3-14 Hv). For this reason, it can be said that In is one of the suitable materials for securing plastic deformation with the load being imposed, resulting in good adhesion that can contact with the backside of the semiconductor device. In this regard, In might be preferably combined with the room-temperature bonding method.

Having In for the material of the thermal conductive bonding material 20, both of the irradiation processes can be conducted at the same time under the same allowable bonding condition to the extend such that the heat stress does not occur in the semiconductor device 12.

As for the radiation component, the radiation component 24 such as shown in FIG. 3(b) is used for describing this embodiment, however, it is noted that some other types of radiation components can be also employed to assemble the semiconductor apparatus so far as their structures are characterized by the modified embodiments within the scope of this invention.

Further, since radiating components 22 and 24 are provided as an integral component with the thermal conducting bonding material 20 and the radiating plate 14 being attached altogether, it is not necessary for the semiconductor manufacturer to align and form a solder or a resin material on the radiating plate before attaching the radiating plate 14 to the substrate 10. Thus, simple assembling operation can be realized for assembling the semiconductor apparatus.

When the thermal conducting bonding material 20 is molten and the back surface of the semiconductor device 12 is bonded to the radiating plate 14 through the thermal conducting bonding material 20 through the methods as described above, the thermal conducting bonding material 20 is completely filled in the clearance between the back surface of the semiconductor device 12 and the internal surface of the radiating plate 14. In this way, heat generated in the semiconductor device 12 is efficiently conducted to the radiating plate 14 through the thermal conducting bonding material 20, resulting in radiating the heat outside.

In has a thermal conductivity of 76 W/m·K. As compared with the case of using epoxy resin, which has thermal conductivity of 1 to 20 W/m·K, as a high temperature conducting resin, the thermal conductivity comes to be significantly improved in In-containing thermal conducting bonding material.

Referring to the radiating plate formed as the In integral type, thus, the operation for bonding the radiating plate 14 to the semiconductor device 12 can be carried out at a low temperature. Consequently, it is possible to prevent the semiconductor device from being subjected to an excessive thermal stress when bonding the radiating plate. Accordingly, it is possible to attain such an advantage that the semiconductor device can be prevented from being damaged in the assembly. For the radiating plate used in the embodiment, moreover, there is used the thermal conducting bonding material 20 having thermal conductivity much higher than that of the thermal conducting bonding material 20 formed by a resin type material. Consequently, the radiating plate can be provided as a radiating plate having a more excellent heat radiating property. Thus, it is possible to provide a semiconductor apparatus capable of mounting a semiconductor device having a larger power.

The aforementioned embodiments employ In as the material constituting the heat radiating plate, however, it is also possible to employ the In-alloys such as InP, InAs and so on, by which the same effect can be expected to have in terms of a good adhesion property in case of performing the room-temperature bonding method.

What is claimed is:

1. A method of manufacturing a radiating plate using In or In-alloy as a thermal conducting bonding material provided between a semiconductor device and a radiating plate and serving to bond a back surface of the semiconductor device to the radiating plate, comprising the steps of:
    forming the radiating plate to take a predetermined shape;
    carrying out plating over a surface of the radiating plate;
    performing a cleaning treatment for cleaning the surface of the radiating plate; and
    pressing an In or In-alloy foil onto a predetermined position of the cleaned surface of the radiating plate, thereby obtaining an In integral type radiating plate, wherein the cleaning treatment facilitates hermetically adhering the In or In-alloy foil to the cleaned surface of the radiating plate and without melting the In or In-alloy foil.

2. The method of manufacturing a radiating plate according to claim 1, wherein an electrolytic treatment for setting the radiating plate to be a cathode in an electrolyte is carried out as the cleaning treatment.

* * * * *

UNITED STATES PATENT AND TRADEMARK OFFICE
CERTIFICATE OF CORRECTION

| | | |
|---|---|---|
| PATENT NO. | : 7,445,965 B2 | Page 1 of 1 |
| APPLICATION NO. | : 11/096058 | |
| DATED | : November 4, 2008 | |
| INVENTOR(S) | : Masatoshi Akagawa et al. | |

It is certified that error appears in the above-identified patent and that said Letters Patent is hereby corrected as shown below:

Column 10, Line 52, Insert --Claim 3 The method of manufacturing a radiating plate according to claim 1, wherein the radiating plate and the In or In-alloy foil are immersed in a sulfuric acid solution respectively for the cleaning treatment.--.

Signed and Sealed this

Thirtieth Day of December, 2008

JON W. DUDAS
*Director of the United States Patent and Trademark Office*